United States Patent
Seko

(10) Patent No.: US 8,158,459 B2
(45) Date of Patent: Apr. 17, 2012

(54) SUBSTRATE BONDING METHOD AND SEMICONDUCTOR DEVICE

(75) Inventor: Toshihiro Seko, Ushiku (JP)

(73) Assignee: Stanley Electric Co., Ltd., Tokyo (JP)

( * ) Notice: Subject to any disclaimer, the term of this patent is extended or adjusted under 35 U.S.C. 154(b) by 904 days.

(21) Appl. No.: 12/142,030

(22) Filed: Jun. 19, 2008

(65) Prior Publication Data

US 2008/0315427 A1    Dec. 25, 2008

(30) Foreign Application Priority Data

Jun. 20, 2007    (JP) ................................ 2007-162508

(51) Int. Cl.
*H01L 21/00*    (2006.01)

(52) U.S. Cl. ............... 438/118; 438/455; 257/E21.508; 257/E21.509; 257/E21.51; 156/272.2

(58) Field of Classification Search .................. 438/118, 438/119, 455
See application file for complete search history.

(56) References Cited

U.S. PATENT DOCUMENTS

| | | | |
|---|---|---|---|
| 7,795,054 B2 * | 9/2010 | Cho et al. ........................ | 438/29 |
| 2006/0057817 A1 | 3/2006 | Sonoda et al. | |
| 2008/0003777 A1 * | 1/2008 | Slater et al. .................... | 438/455 |
| 2008/0073665 A1 * | 3/2008 | Slater et al. .................... | 257/103 |
| 2008/0268616 A1 * | 10/2008 | Sonoda et al. ................ | 438/455 |

FOREIGN PATENT DOCUMENTS

| JP | 05-235323 A | 9/1993 |
|---|---|---|
| JP | 2006-086208 A | 3/2006 |
| JP | 2006-332435 A | 12/2006 |

* cited by examiner

*Primary Examiner* — David Zarneke

(74) *Attorney, Agent, or Firm* — Holtz, Holtz, Goodman & Chick, PC

(57) ABSTRACT

(a) A first Sn absorption layer (5) is formed on the principal surface of a first substrate (1), the first Sn absorption layer being made of metal absorbing Sn from AuSn alloy and lowering a relative proportion of Sn in the AuSn alloy. (b) A second Sn absorption layer (17) is formed on the principal surface of a second substrate (11) the second Sn absorption layer being made of metal absorbing Sn from AuSn alloy and lowering a relative proportion of Sn in the AuSn alloy. (c) A solder layer (7) made of AuSn alloy is formed at least on one Sn absorption layer of the first and second Sn absorption layers. (d) The first and second substrates are bonded together by melting the solder layer in a state that the first and second substrates are in contact with each other, with the principal surfaces of the first and second substrates facing each other.

14 Claims, 11 Drawing Sheets

FIG.1C
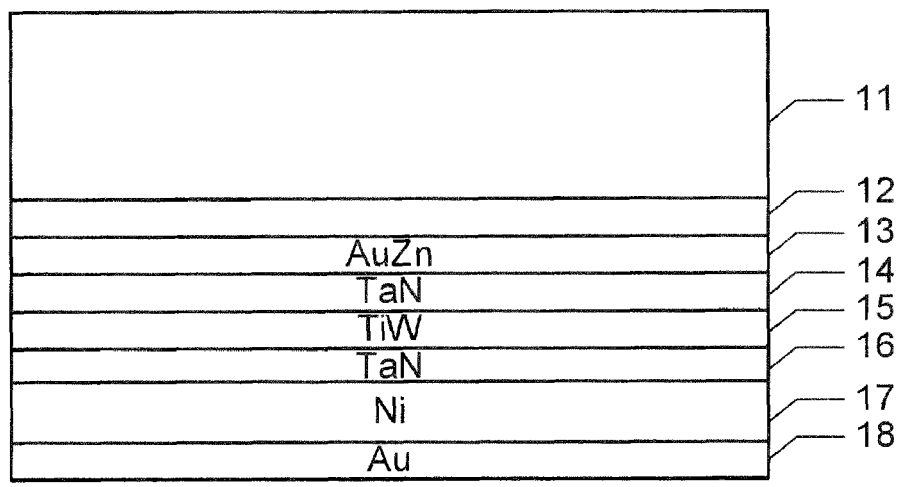
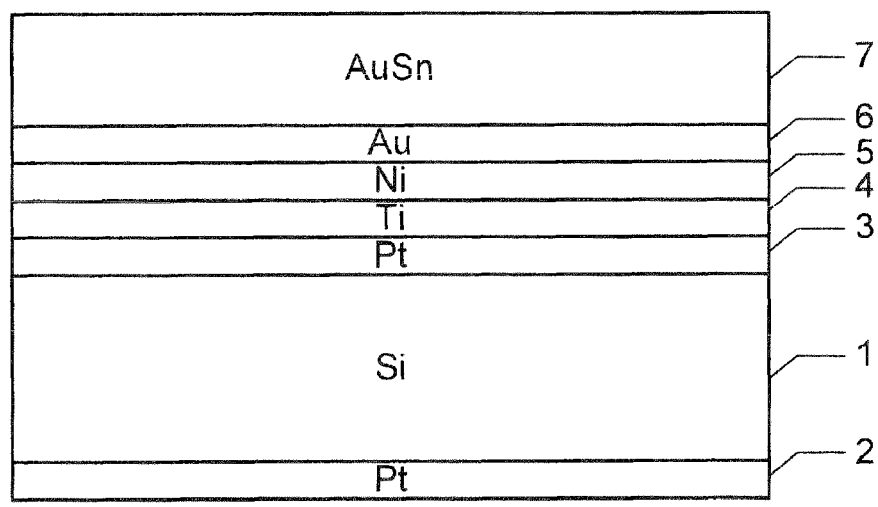

FIG.2

| SAMPLE No. | Thickness of solder layer 7 (nm) | T(Au)/T(AuSn) | Thickness of 1st Sn absorption layer 5 (nm) | Thickness of 2nd Sn absorption layer 17 (nm) | T(Ni)/T(AuSn) | Evaluation Result |
|---|---|---|---|---|---|---|
| 1 | 600 | 0.1 | 100 | 300 | 0.66 | ○ |
| 2 | 600 | 0.1 | 100 | 200 | 0.5 | ○ |
| 3 | 600 | 0.22 | 100 | 300 | 0.66 | ○ |
| 4 | 950 | 0.22 | 100 | 540 | 0.66 | ○ |
| 5 | 600 | 0.22 | 100 | 600 | 1.16 | ○ |
| 6 | 600 | 0.39 | 100 | 300 | 0.66 | △ |
| 7 | 800 | 0.39 | 100 | 440 | 0.66 | △ |
| 8 | 600 | 0.39 | 100 | 400 | 0.83 | △ |
| 9 | 400 | 0.39 | 100 | 230 | 0.82 | △ |
| 10 | 600 | 0.55 | 100 | 300 | 0.66 | × |
| 11 | 600 | 0.22 | 100 | 100 | 0.33 | × |
| 12 | 600 | 0 | 100 | 300 | 0.66 | ○ |
| 13 | 600 | 0.1 | 100 | 150 | 0.41 | ○ |

SAMPLE3

AuSnNi

RATIO OF NUMBER OF ATOMS (%)

FIG.4A SAMPLE6
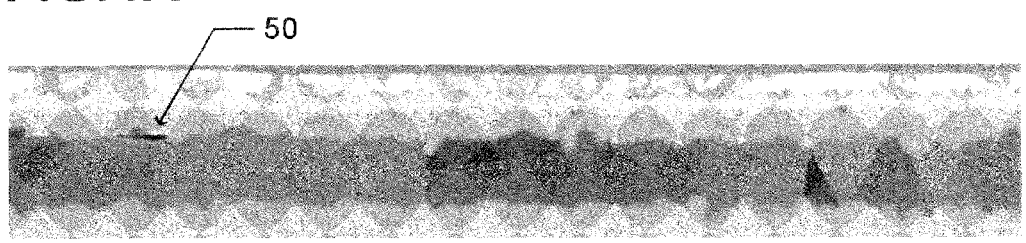
FIG.4B SAMPLE10
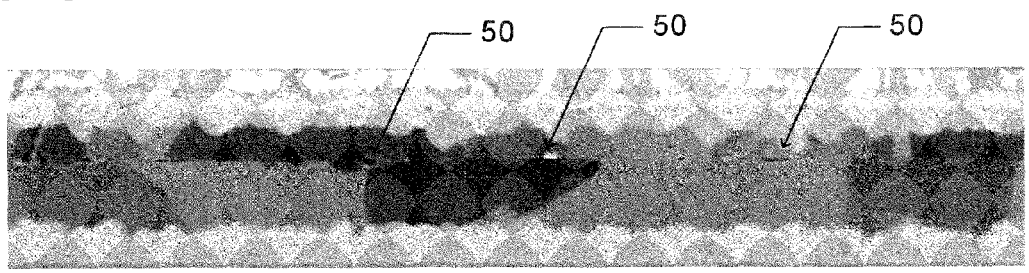

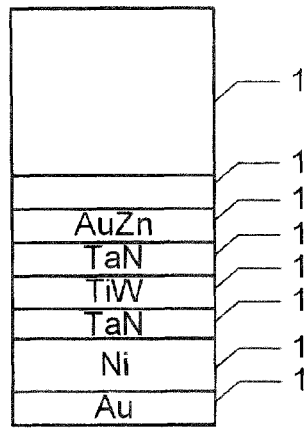
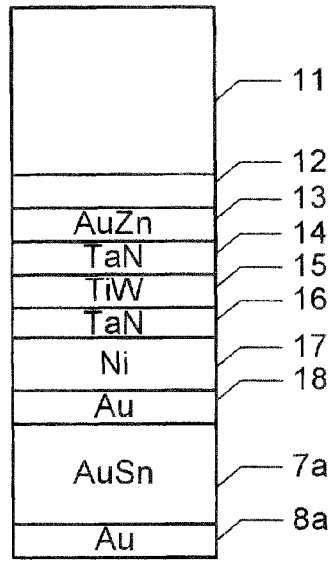
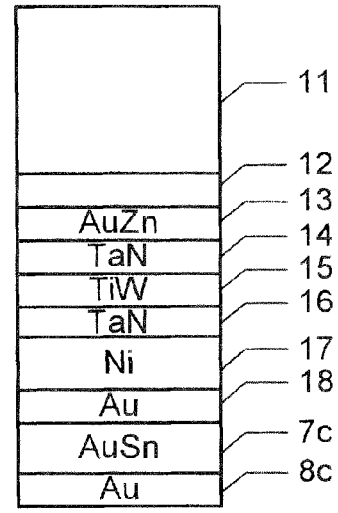
FIG.5A   FIG.5B   FIG.5C
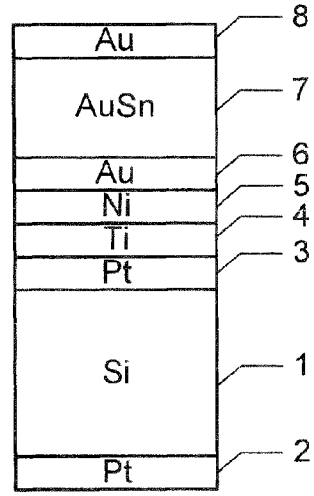
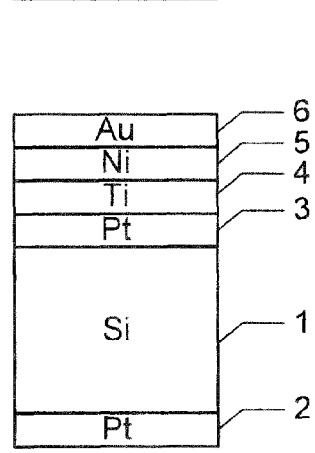
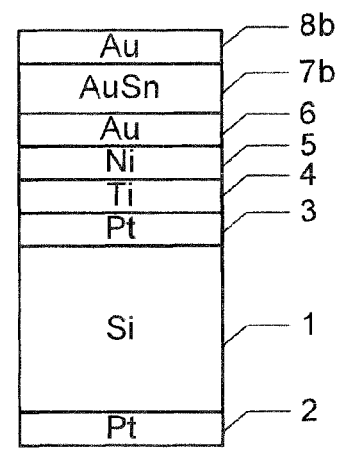

FIG.6A
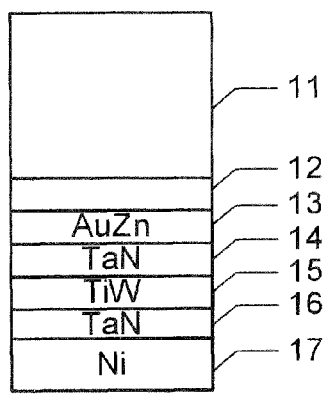
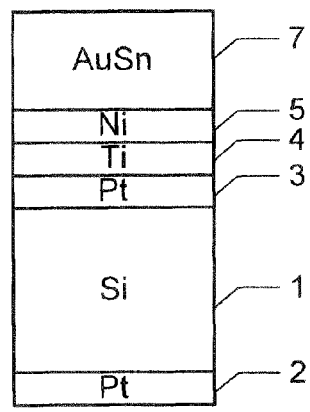
FIG.6B
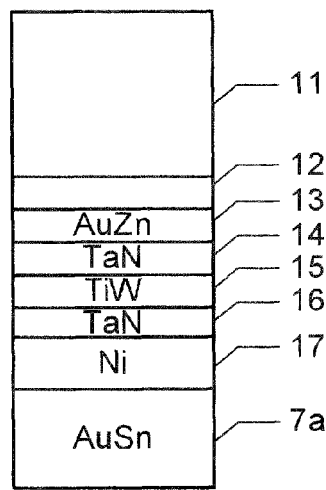
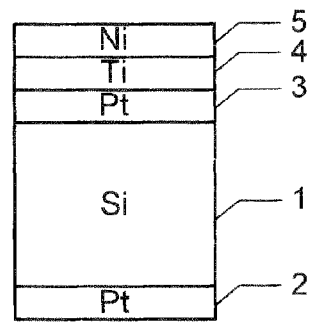
FIG.6C
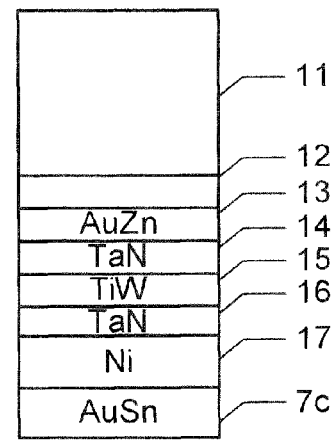
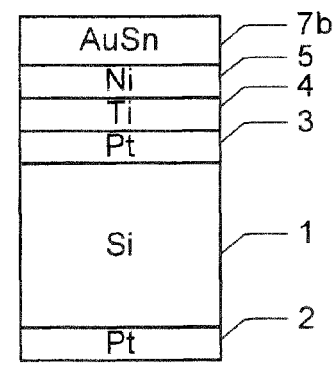

SUBSTRATE BONDING METHOD AND SEMICONDUCTOR DEVICE

CROSS REFERENCE TO RELATED APPLICATION

This application is based on and claims priority of Japanese Patent Application No. 2007-162508 filed on Jun. 20, 2007, the entire contents of which are incorporated herein by reference.

BACKGROUND OF THE INVENTION

A) Field of the Invention

The present invention relates to a substrate bonding method of bonding two substrates together by using AuSn solder, and a semiconductor device having a bonding region formed by AuSn solder.

FIG. 7A is a schematic cross sectional view showing a semiconductor device before bonding, disclosed in JP-A-2006-86208. On a principal surface of a support substrate 61, an Au layer 62, a Ti layer 63, a Ni layer 64 and an AuSn solder layer 65 are laminated in this order. On a principal surface of a temporary substrate 70, an emission layer 71, an AuZn layer 72, a TaN layer 73, an Al layer 74, a Ta layer 75 and an Au layer 76 are laminated in this order. The Au layer 76 is in contact with the AuSn solder layer 65, and heating is performed to melt, and then the AuSn solder layer 65 is solidified to bond the temporary substrate 70 including the emission layer 71 to the support substrate 61. After bonding, the temporary substrate 70 is etched and removed. The AuZn layer 72 has a function of reflecting light irradiated from the emission layer 71 and improving optical emission efficiency.

The Ni layer 64 prevents ball-up during re-solidification of the overlying AuSn solder layer 65 after melting. The "ball-up" is a phenomenon that AuSn liquefied once at its eutectic temperature or higher segregates on the support substrate 61, and partially rises. The TaN film 73 prevents permeation of AuSn solder into the AuZn layer 72.

FIG. 7B shows a bonding structure of a laser chip disclosed in JP-A-2006-332435. On a support substrate 61 made of silicon, a Ni layer 64, an Au layer 66 and an AuSn solder layer 65 are laminated in this order. An Au layer 82 is formed on a bottom surface of a laser chip 81. The Au layer 82 is in contact with the AuSn solder layer 65, and heating is performed to bond the laser chip 81 to the support substrate 61. The Ni layer 64 prevents ball-up during melting of the AuSn layer 65.

FIG. 7C shows a bonding stricture of a semiconductor device disclosed in JP-A-HEI-5-235323. On the bottom surface of a GaAs substrate 91, an AuGe layer 92, a Ni layer 93, an AuSn solder layer 94 and an Au layer 95 are laminated in this order. The Au layer 95 is in contact with a package substrate 61, and heating is performed to mount the GaAs substrate 91 on the package substrate 61. The Ni layer 93 enhances adhesion of the AuSn solder layer 94.

SUMMARY OF THE INVENTION

An AuSn solder layer is preferably made thin in order to lower thermal resistance of a bonding region and reduce material cost. However, as the AuSn layer is made thin, voids are likely to be generated on a bonded interface. Voids generated on the bonded interface cause a lowered bonding strength and an increased thermal resistance. If a bonded interface in a semiconductor device contains voids, thermal resistance of the semiconductor device increases, a drive voltage rises, and the device lifetime characteristics are degraded.

An object of this invention is to provide a bonding method capable of preventing voids from generating on a bonded interface. Another object of this invention is to provide a semiconductor device bonded by this bonding method.

According to one aspect of the present invention, there is provided a substrate bonding method comprising steps of:

(a) forming a first Sn absorption layer on a principal surface of a first substrate, the first Sn absorption layer being made of metal absorbing Sn from AuSn alloy and lowering a relative proportion of Sn in the AuSn alloy;

(b) forming a second Sn absorption layer on a principal surface of a second substrate, the second Sn absorption layer being made of metal absorbing Sn from AuSn alloy and lowering a relative proportion of Sn in the AuSn alloy;

(c) forming a solder layer made of AuSn alloy at least on one Sn absorption layer of the first and second Sn absorption layers; and (d) melting the solder layer to bond the first and second substrate together, in a state that the first and second substrates are in contact with each other, with the principal surfaces of the first and second substrates facing each other.

According to another aspect of the present invention, there is provided a semiconductor device comprising:

a first substrate;

an operation layer made of semiconductor and bonded to the first substrate; and a bonding layer made of alloy containing Au, Sn and another third element, the bonding layer bonding the operation layer to the first substrate, wherein defining in the bonding layer a central region, a first region disposed between the central region and the first substrate, and a second region disposed between the central region and the operation layer, a relative proportions of elements in the bonding layer in such a manner that a relative proportion of Sn in the central region is smaller than that in either of the first and second regions a relative proportion of Au in the central region is larger than that in either of the first and second regions, and a relative proportion of the third element in the central region is smaller than that in either of the first and second regions.

Since the first and second Sn absorption layers absorb Sn in the solder layer, relative proportion of the Sn that the solder layer contains lowers. A melting point of the solder layer after solidification rises therefore, and it is hard to be re-melted. Since the Sn absorption layers are disposed on both sides of the solder layer, Sn is absorbed from both sides of the solder layer. Absorption of Sn makes the melted solder layer gradually solidify so that voids do not remain on the bonded interface, and good bonding structure can be obtained.

BRIEF DESCRIPTION OF THE DRAWINGS

FIGS. 1A to 1F are cross sectional views of a substrate, illustrating a substrate bonding method according to a first embodiment.

FIG. 2 is a table showing the structures and evaluation results of samples manufactured by the method of the first embodiment and a method according to a modification of the first embodiment.

FIGS. 4A and 4B are cross sectional photographic views of a sample No. 6 and a sample No. 10.

FIGS. 5A to 5C are cross sectional views of substrates to be bonded by bonding methods according to second to fourth embodiments.

FIGS. 6A to 6C are cross sectional views of substrates to be bonded by bonding methods according to fifth to seventh embodiments.

DESCRIPTION OF THE PREFERRED EMBODIMENTS

A substrate bonding method of the first embodiment will be described with reference to FIGS. 1A to 1F.

Figure 1A:
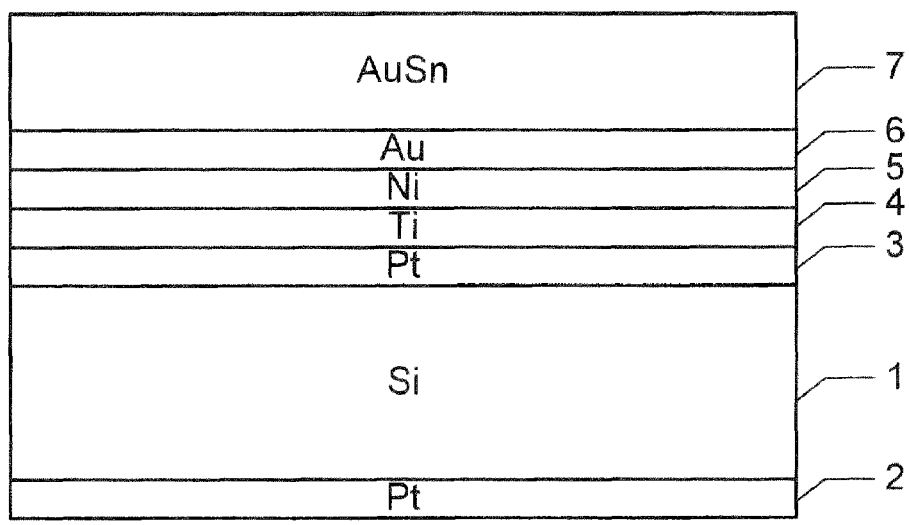

As shown in FIG. 1A, a Pt layer 3 is formed on the principal surface of a first substrate 1 made of silicon (Si) and doped with n- or p-type dopant, and a Pt layer 2 is also formed on the bottom surface opposite to the principal surface. In the first embodiment, a Si substrate was used which had a B concentration of $3 \times 10^{-18}$ cm$^{-3}$ or higher (specific resistance of 0.02 Ωcm or lower) and had a (100) crystal surface.

The Pt layer is formed, for example, resistance heating evaporation, electron beam evaporation, sputtering or the like. A thickness of each of the Pt layers 2 and 3 is preferably 25 nm or thicker in order to use the Pt layer as an ohmic electrode. Since a work function of Pt is larger than that of p-type Si, an ohmic contact can be retained between the Pt layers 2, 3 and the first substrate 1. Since a heating process is executed at a later thermocompression bonding process, silicidation progresses so that an ohmic contact and low contact resistance can be maintained. The first substrate 1 may be made of conductive material having a high thermal conductivity such as Cu, instead of Si.

On the Pt layer 3, a Ti layer 4 of 150 nm thick is formed. On the Ti layer 4, a first Sn absorption layer 5 of 100 nm thick made of Ni is formed. The Ti layer 4 and first Sn absorption layer 5 are formed, for example, by electron beam evaporation or sputtering. The Ti layer 4 enhances adhesion of the overlying first Sn absorption layer 5.

On the first Sn layer 5, an Au layer 6 is formed, and on this Au layer 6, a solder layer 7 made of AuSn alloy is formed. The Au layer 6 and solder layer 7 are formed, for example, by resistance heating evaporation or sputtering. Thicknesses of the Au layer 6 and solder layer 7 are, e.g., 30 nm and 600 nm, respectively. A relative proportion of Au and Sn contained in the solder layer 7 is about 8:2 by weight and about 7:3 by number of atoms. Additive other than Au and Sn may be added to the solder layer 7.

Figure 1B:
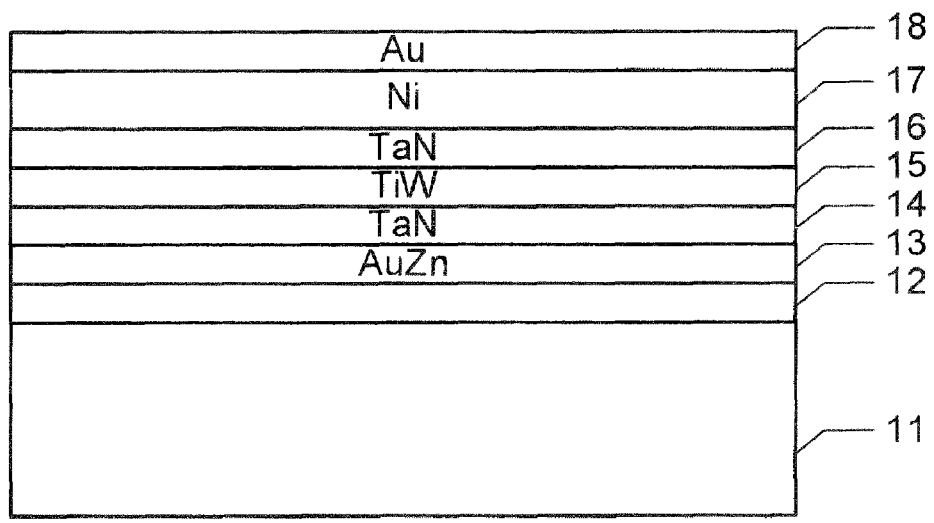

As shown in FIG. 1B, an operation layer 12 including a plurality of semiconductor layers is epitaxially grown on the principal surface of a second substrate 11 made of semiconductor. The operation layer 12 is an emission layer which emits light having a wavelength intrinsic to semiconductor material by injecting electrons and holes for example. As the material of the second substrate 11, semiconductor material is selected having a crystal structure and a lattice constant allowing the semiconductor material of the operation layer 12 to be epitaxially grown at a high quality.

For example, if the operation layer 12 is made to have a multiple quantum well structure having well layers and barrier layers made of AlGaInP-based compound semiconductor, a GaAs substrate is used as the second substrate 11. The operation layer 12 may have a homo pn junction structure, a double hetero structure or a single hetero structure. The semiconductor emission layer may be sandwiched between an n-type clad and a p-type clad.

On the operation layer 12, a reflection electrode layer 13 is formed. The reflection electrode layer 13 has a function of improving light emission efficiency by reflecting light generated in the operation layer 12, in addition to a function of an electrode. The reflection electrode layer 13 is made of metal capable of ohmic contact with the operation layer 12. If a surface layer of the operation layer 12 on the side of the reflection electrode layer 13 is made of p-type AlGaInP, AuZn can be used as the material of the reflection electrode layer 13. In this case, the reflection electrode layer 13 can be formed by resistance heating evaporation, electron beam evaporation or sputtering. A thickness of the reflection electrode layer 13 is, for example, 300 nm.

On the reflection electrode layer 13, a TaN layer 14 of 100 nm thick is formed by reactive sputtering. After the TaN layer 14 is formed, heat treatment is performed at about 500° C. in a nitrogen atmosphere. This heat treatment makes an alloy of the reflection electrode layer 13 of AuZn and the surface layer of p-type AlGaInP of the operation layer 12. In the result, good ohmic contact can be obtained. The TaN layer 14 prevents infiltration of AuSn eutectic melted in a later process into the reflection electrode layer 13.

On the TaN layer 14, a TiW layer 15 of 100 nm thick and a TaN layer 16 of 100 nm thick are formed by reactive sputtering. On the TaN layer 16, a second Sn absorption layer 17 of Ni is formed by electron beam evaporation or sputtering. A thickness of the second Sn absorption layer 17 is set to 300 nm. On the second Sn absorption layer 17, an Au layer 18 of 30 nm thick is formed by resistance heating evaporation or sputtering. The Au layer 18 prevents oxidation of the Ni layer 17.

Figure 1D:
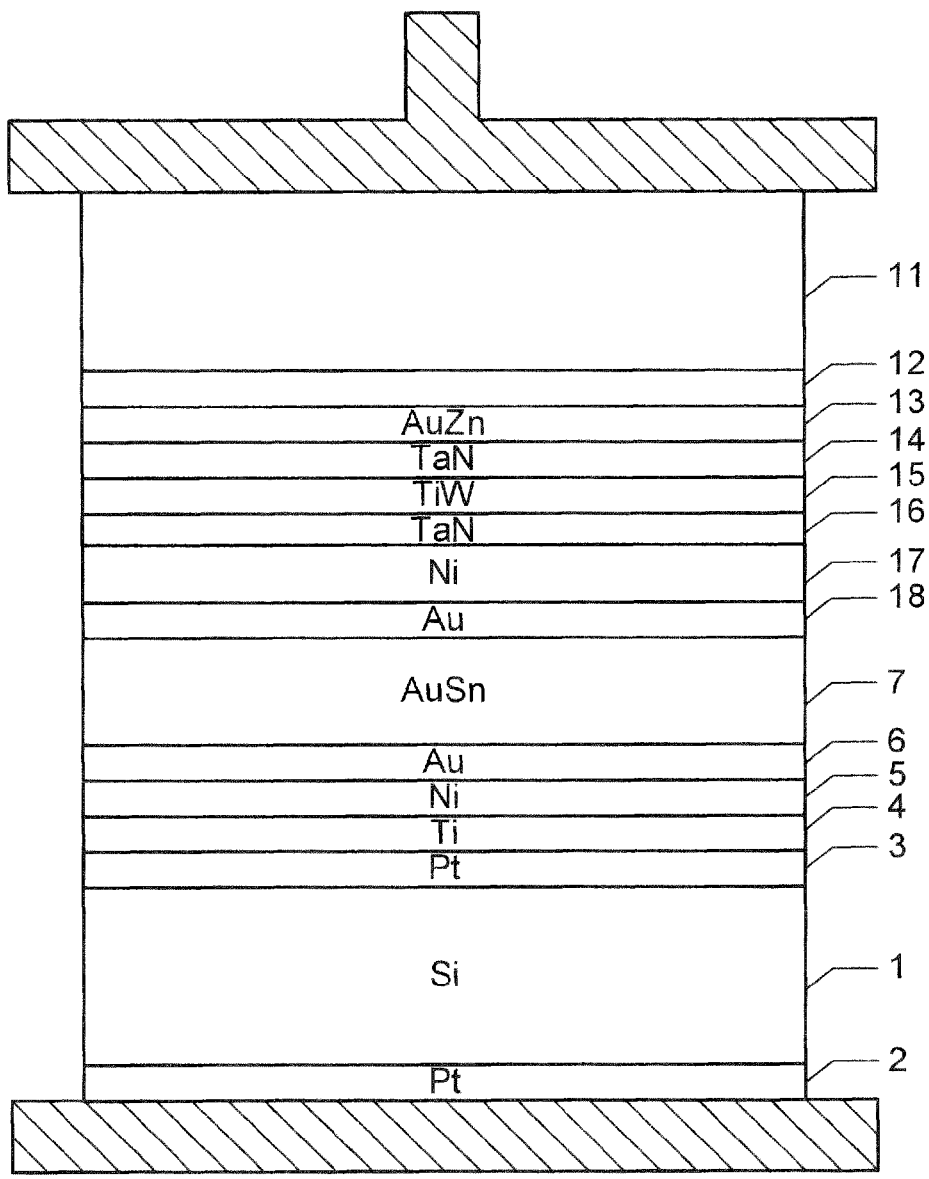
Figure 1E:
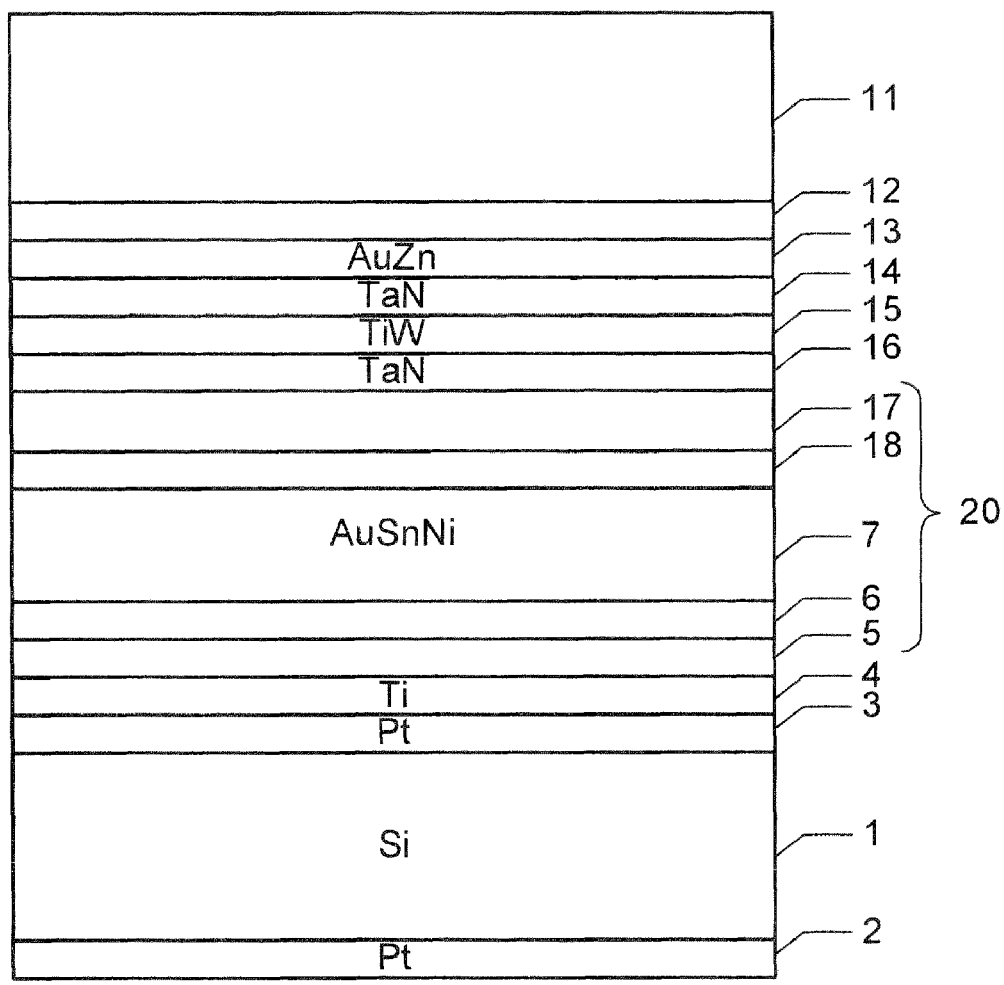

As shown in FIG. 1C, the first substrate 1 and second substrate 11 are disposed with their principal surfaces being faced each other. As shown in FIG. 1D, the AuSn solder layer 7 on the first substrate 1 and the Au layer 18 on the second substrate 11 are in contact with each other, and thermocompression bonding is performed in a nitrogen atmospheres. The thermocompression bonding conditions are as follows:

Pressure: about 1 MPa
Temperature: 320 to 370° C.
Thermocompression bonding time: 10 minutes As shown in FIG. 1E, the AuSn solder layer 7 melts, Au in the Au layers 6 and 18 and Ni in the first and second Sn absorption layers 5 and 17 are dissolved in the melted solder layer 7, and Au and Sn in the Au layers 6 and 18 and solder layer 7 are diffused into and absorbed in the first and second Sn absorption layers 5 and 17. As the melted solder layer 7 is solidified, a bonding layer 20 made of AuSnNi is therefore formed. After bonding, the second substrate 11 is removed. If the second substrate 11 is made of GaAs, the second substrate 11 can be removed, by wet etching using mixture liquid of aqueous solutions of ammonia and hydrogen peroxide. Instead of wet etching, the second substrate may be removed by dry etching, chemical mechanical polishing, mechanical polishing or the like.

Figure 1F:
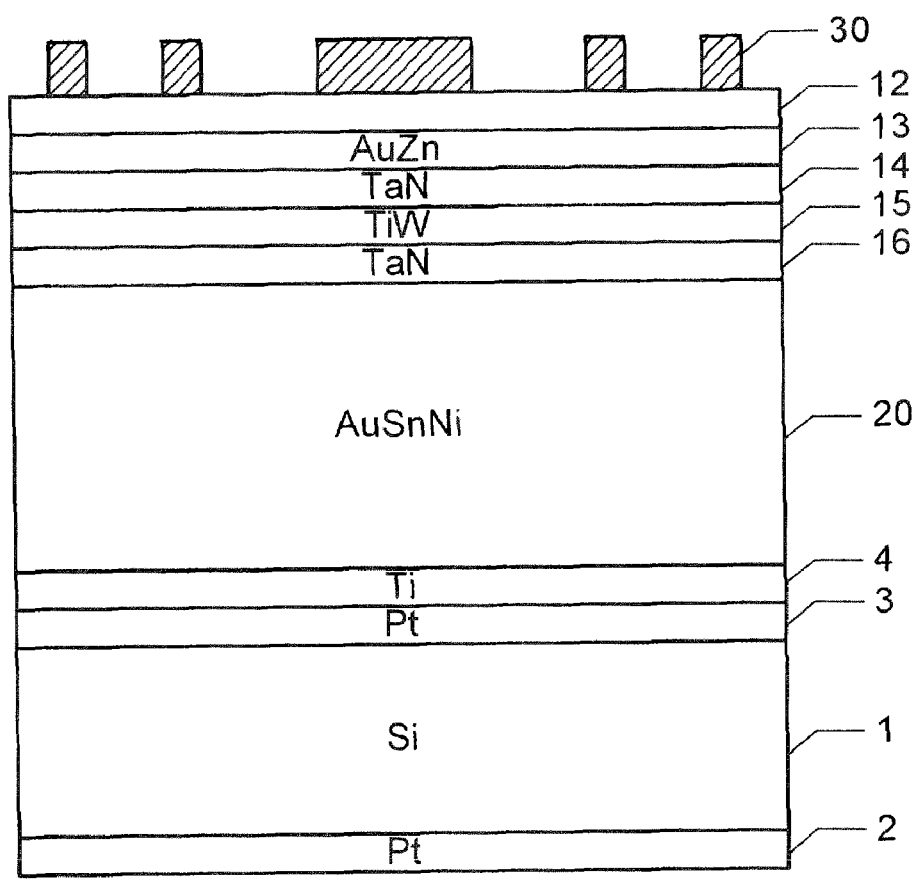

As shown in FIG. 1F, the surface of the operation layer 12 is exposed. Front side electrodes 30 are formed in partial areas of the exposed surface. If n-type AlGaInP is exposed on the operation layer 12 contacting the front side electrodes 30, AuSnNi, AuGeNi, AuSn or AuGe may be used as the material of the front side electrodes 30. The front side electrodes 30 can be formed by film formation by resistance heating evaporation, electron beam evaporation, sputtering or the like, and lift-off. After the front side electrodes 30 are formed, heat treatment is performed at about 400° C. in a nitrogen atmosphere to ensure ohmic contact.

Carriers are supplied to the operation layer 12 from the Pt layer 2 on the bottom surface of the first substrate 1 and front side electrodes 30. Light generated in the operation layer 12 is emitted through the surface on which the front side electrodes 30 are formed.

A sample was manufactured by the substrate bonding method of the first embodiment, and a plurality of samples were manufactured by changing thicknesses of the solder layer 7, Au layers 6 and 18 and second Sn absorption layer 17. A thickness of the first Sn absorption layer 5 was set to 100 nm. Bonding structures of these samples were evaluated.

FIG. 2 shows structures and evaluation results of the manufactured samples. T(Au) shown in FIG. 2 indicates a total thickness of the Au layers disposed between the first and second Sn absorption layers 5 and 17, T(AuSn) indicates a thickness of the solder layer 7, and T(Ni) indicates a total thickness of the first and second Sn absorption layers 5 and 17. The sample manufactured by the first embodiment method corresponds to a sample No. 1 in FIG. 2.

Figure 3A:
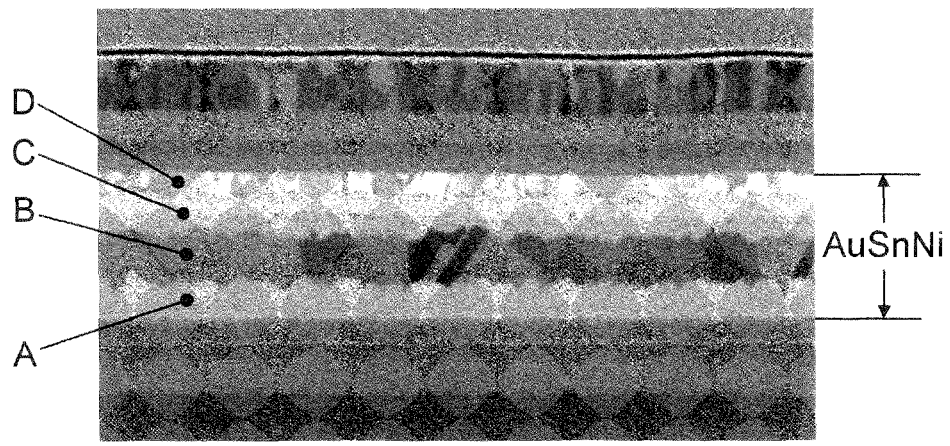
FIG. 3A is a cross sectional photographic view of a sample No. 3.

FIG. 3A is a cross sectional photographic view of the bonding layer of a sample No. 3. It can be seen that the bonding layer made of AuSnNi is partitioned into four regions being different in appearance in a thickness direction.

Figure 3B:
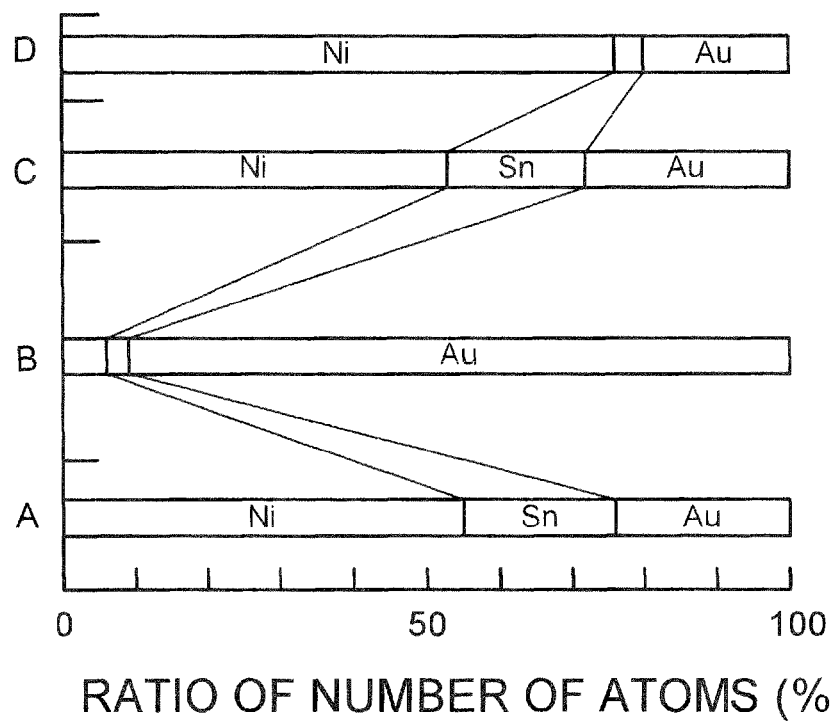
FIG. 3B is a graph showing measurement results of relative proportions of elements in each region.
Figure 7A:
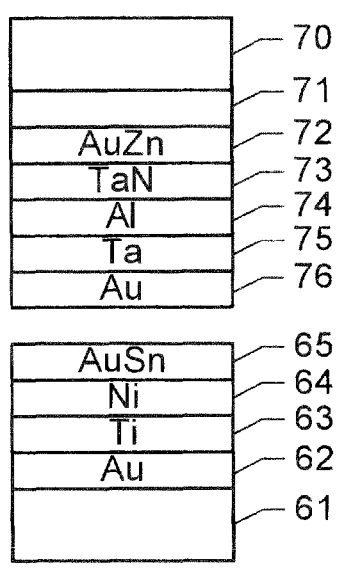
FIGS. 7A to 7C are cross sectional views of substrates to be bonded by a conventional soldering method.
Figure 7B:
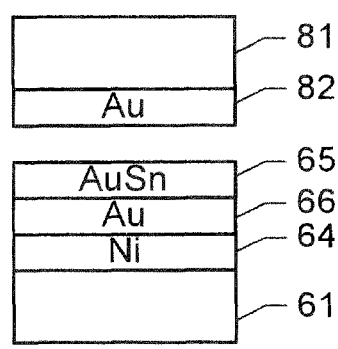
Figure 7C:
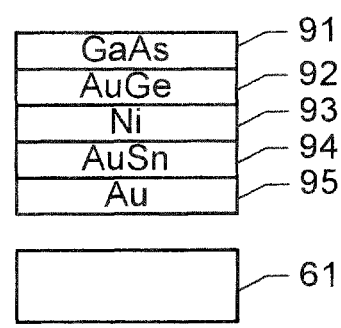

FIG. 3B shows measurement results, by Auger electron spectroscopy of relative proportions of elements in the four regions A to D at different positions in the thickness direction of the bonding layer. An abscissa represents relative proportions in number of atoms in the unit of "%". Regions A to D are disposed in the bonding layer 20 sequentially in the order from the first substrate 1 side.

The relative proportion of Sn in the region B positioned roughly in the center of the bonding layer 20 is smaller than that in either of the region A or the region C. The relative proportion of Au in the central region B is larger than that in either of the region A or the region C. The relative proportion of Ni in the central region B is smaller than that in either of the region A or the region C. In the regions A and C, the relative proportion of Ni is larger than either of the relative proportion of Au or the relative proportion of Sn. In the central region B, the relative proportion of Au is larger than the relative proportion of Ni, and the relative proportion of Ni is larger then the relative proportion of Sn. It has been confirmed that the region D becomes thin as the second Sn absorption layer 17 is made thinner than that of the sample 3.

It can be understood that Sn in the solder layer 7 is absorbed in the first and second Sn absorption layers 5 and 17, because the relative proportion of Sn in the region B is smaller than those in the regions A and C on both sides of the region B. The relative proportion of Au in the solder layer 7 before melting was 70% in number of atoms. In contrast, the relative proportion of Au in the solder layer 7 after re-solidification is 90% or higher in number of atoms. It can be understood from this result that the first and second absorption layers 5 and 17 preferentially-absorb Sn compared to Au. The reason why the relative proportion of Sn in the region D is smaller than that in the region C may be ascribed to that Sn is not sufficiently diffused to the opposite surface of the second Sn absorption layer 17 because the second Sn absorption layer 17 of 300 nm thick is thicker than the first Sn absorption layer 5 of 100 nm thick.

Because the relative proportion of Au in the region B is higher than that in the solder layer 7 before melting, a melting point of the region B is higher than a melting point of the original solder layer 7. More specifically, a melting point of AuSn alloy containing Au, the relative proportion of which is 70%, is about 280° C., whereas a melting point of AuSn alloy containing Au, the relative proportion of which is 90%, is about 900° C. Therefore, when a semiconductor device after bonding is mounted on a package substrate or the like, the bonding layer is hard to be re-melted. The property of difficulty in re-melting after bonding is called "re-melting durability". In the embodiment described above, re-melting durability can be enhanced by increasing the relative proportion of Au in the solder layer after solidification.

FIGS. 4A and 4B are cross sectional photographic views of samples Nos. 6 and 10. Voids 50 were observed on the bonded interface of either sample. However, the sample No. 6 had few voids, and sufficient tight adhesion was retained. The sample No. 10 had many voids, and sufficient tight adhesion was not retained.

In FIG. 2, evaluation of the sample in which voids were not observed at the bonding interface is represented by "O", evaluation of the sample in which although voids were observed, sufficient tight adhesion was able to be retained is represented by "Δ", and evaluation of the sample in which sufficient tight adhesion was not able to be retained because of many voids is represented by "x". It is possible to prevent generation of voids at the bonding interface by setting T(Au)/T(AuSn) to 0.22 or smaller. Sufficient tight adhesion can be retained by setting T(Au)/T(AuSn) to 0.39 or smaller.

Description will now be made on the cause-and-effect relationship between a ratio of a total thickness of the Au layers to a thickness of the solder layer 7 and generation of voids.

A melting point of AuSn solder (Au:Sn=7:3 in number of atoms) of the solder layer 7 is about 280° C., and rises even if the relative proportions of Au and Sn shift in either direction. If the relative proportions shifts in a direction of increasing the relative proportion of Au, a rise tendency of the melting point is steep. As the Au layer becomes relatively thick, Au atoms in the Au layer dissolve in the melted AuSn solder layer when the AuSn solder layer 7 melts, and the relative proportion of Au in the dissolved region becomes high. A solidification speed therefore increases, and the solder layer is solidified before air bubbles generated on the bonded interface are released from the bonded interface. In the result, voids are considered to be generated on the bonded interface.

If the Au layer is thin, it is not dominant that the relative proportion of Au rises because Au of the Au layer dissolves in the melted solder layer 7, but it is dominant that the relative proportion of Au rises because Sn is absorbed in the first and second Sn absorption layers 5 and 17. Since Sn is gently absorbed in the first and second Sn absorption layers 5 and 17, a rise in the relative proportion of Au in the melted solder layer is also gentle. Therefore, a time until the solder layer 7 is solidified is prolonged. It can be considered that generation of voids is prevented because it is possible to retain the time required for air bubbles generated on the bonded interface to move to the ends of the bonded interface and be released to the external.

Next, description will be made on material other than Ni to be used as the material of the first and second Sn absorption layers 5 and 17.

The first and second Sn absorption layers 5 are required to have the property of preferentially absorbing Sn from melted AuSn solder and making the relative proportion of Sn in AuSn solder after solidification be smaller than that of AuSn solder before melting. With this property, a melting point of AuSn solder rises and re-melting durability can be enhanced. In order to avoid ball-up during melting of AuSn solder, it is required that AuSn solder wettability is high. Such material includes Pt and Pd, other than Ni.

Next, description will be made of a preferable thickness of the first and second Sn absorption layers 5 and 17 made of Ni.

If the first and second Sn absorption layers 5 and 17 are too thin as compared to the solder layer 7, Sn in the solder layer 7 cannot be absorbed sufficiently. In this case, the relative proportions of Au and Sn in the solder layer 7 after solidification are hardly changed from those before melting in some regions. As the regions in which the relative proportions are not changed are left, sufficient re-melting durability cannot be retained. Of the samples 1 to 5, 12 and 13 evaluated as "O", the sample No. 13 has a minimum T(Ni)/T(AuSn) value of 0.41. This sample No. 13 had a reduced relative proportion of Sn in the solder layer after solidification, and retained sufficient re-melting durability. It can therefore be considered that sufficient re-melting durability can be retained by setting T(Ni)/T(AuSn) to 0.41 or larger. In the sample No. 11 having T(Ni)/T(AuSn) of 0.33 adhesion on the bonded interface was weak, and partial stripping occurred.

The first Sn absorption layer 5 has preferably a thickness of 100 nm or thicker in order to improve wettability with respect to the solder layer 7 and suppress ball-up. It has been confirmed that the samples Nos. 1 to 5 having the first Sn absorption layer 5 of 100 nm thick can prevent ball-up.

A thickness of the second Sn absorption layer 17 is required to be determined from the viewpoint of not generating voids on the bonded interface, because the surface thereof becomes the bonded interface. For example, in order to retain sufficient re-melting durability, T(Ni)/T(AuSn) is set to 0.41 or larger. T(Ni) is a total thickness of the first and second Sn absorption layers 5 and 17. Therefore, as the first Sn absorption layer 5 is made thick, the second Sn absorption layer 17 can be thinned relatively.

At the initial stage of bonding, a portion of the second Sn absorption layer 17 melts together with the solder layer 7 and takes a state that air bubbles are contained. As described earlier, given a sufficient time of a melting state, air bubbles move to the ends of the bonded interface and are released to the external. However, if the second Sn absorption layer 17 is made too thin, the whole region of the second Sn absorption layer 17 melts together with the solder layer 7, and the TaN layer 16 being in contact with the second Sn absorption layer 17 becomes in contact with the air bubbles. Since the TaN layer 16 has poor wettability with respect to solder, a state where the TaN layer is in contact with the air bubbles is rather stable. Air bubbles are therefore difficult to move, the solder layer is solidified holding the air bubbles therein, and voids are generated on the bonded interface.

As described above, when the layer being in contact with the second Sn absorption layer 17 is made of material having poor wettability with respect to solder, it is preferable to thicken the second Sn absorption layer 17 to such a degree that a region not melted remains in a partial region of the second Sn absorption layer 17 on the side opposite to the solder layer 7. For example, when a thickness of the second Sn absorption layer 17 is 150 nm or thicker, it is possible to prevent air bubbles from becoming resident. When the layer being in contact with the second Sn absorption layer 17 is made of material having good wettability with respect to melted solder, the second Sn absorption layer 17 may be made thinner than 150 nm.

Considering various circumstances, a thickness of the second Sn absorption layer 17 is preferably set to 150 nm or thicker in order to prevent generation of voids on the bonded interface. The sample No. 13 having the second Sn absorption layer 17 of 150 nm thick has a good bonded interface without voids.

When the solder layer 7 of AuSn is made thick, a region having approximately the same relative proportions of Au and Sn as those in the solder layer 7 appears near the central area of the region B shown in FIG. 3B in the thickness direction. Also in this case, the bonding layer contains the regions A and C having Ni as their main compositions and the region B between the regions A and C having Au as its main composition, so that a good bonded interface without voids can be obtained.

FIGS. 5A to 5C are cross sectional views of substrates before bonding to be used by substrate bonding methods according to the second to fourth embodiments. Namely, FIGS. 5A to 5C correspond to FIG. 1C of the first embodiment.

As show in FIG. 5A, in the second embodiment, the surface of an AuSn solder layer 7 is covered with an Au layer 8. In this case, a total thickness T(Au) of Au layers disposed between a first Sn absorption layer 5 and a second Sn absorption layer 17 is equal to a total thickness of Au layers 6, 8 and 18.

As shown in FIG. 5B, in the third embodiment, an AuSn solder layer is formed not on the first substrate 1 but on the second substrate 11. On the first substrate 1, an Au layer 6 formed on a first Sn absorption layer 5 is exposed. An AuSn solder layer 7a is formed on the surface of an Au layer 18 on the second substrate 11, and the surface of the AuSn solder layer 7a is covered with an Au layer 8a.

As shown in FIG. 5C, in the fourth embodiment, an AuSn solder layer is formed on either of a first substrate 1 or a second substrate 11. On the first substrate 1, a solder layer 7b is formed on an Au layer 6, and the surface of the solder layer 7b is covered with an Au layer 8b. On the second substrate 11, a solder layer 7c is formed on the surface of an Au layer 18, and the surface of the solder layer 7c is covered with an Au layer 8c. In this case, a total thickness T(AuSn) of AuSn solder layers is equal to a total of a thickness of the solder layer 7b on the first substrate 1 and a thickness of the solder layer 7c on the second substrate 11.

FIGS. 6A to 6C are cross sectional views of substrates to be used by substrate bonding methods according to the fifth to seventh embodiments. Namely, the cross sectional views correspond to the cross sectional view shown in FIG. 1C of the first embodiment.

As shown in FIG. 6A, in the fifth embodiment, the Au layer 6 and 18 shown in FIG. 1C of the first embodiment are not disposed. The sample No. 12 shown in FIG. 2 corresponds to the structure of the fifth embodiment, and its T(Au)/T(AuSn) is 0. As shown in FIG. 6B, in the sixth embodiment, the Au layers 6, 8a and 18 shown in FIG. 5B of the third embodiment are not disposed. As shown in FIG. 6C, in the seventh embodiment, the Au layers 6, 8b, 8c and 18 shown in FIG. 5C of the fourth embodiment are not disposed, As described earlier, even the structures of the second to seventh embodiments are expected to present same advantages to those of the first embodiment.

In the third embodiment shown in FIG. 5B and in the sixth embodiment shown in FIG. 6B, the surface of the first Sn absorption layer 5 on the first substrate 1 or the surface of the overlying Au layer 6 constitutes the bonded interface. Therefore, in order to prevent generation of voids on the bonded interface, it is preferable that a thickness of the first Sn absorption layer 5 is set to 150 nm or thicker. It is sufficient if a thickness of the second Sn absorption layer 17 is 100 nm or thicker.

In the fourth embodiment shown in FIG. 5C and in the seventh embodiment shown in FIG. 6C, either of the first Sn absorption layer 5 or the second Sn absorption layer 17 is spaced apart from the bonding interface so that it is sufficient if a thickness of each layer is 100 nm or thicker. However, also in the second to seventh embodiments, in order to retain sufficient re-melting durability, T(Ni)/T(AuSn) is preferably set to 0.41 or larger, as in the case of the first embodiment.

In each sample shown in FIG. 2, although a thickness of the AuSn solder layer 7 is set to 600 nm to 950 nm, different thicknesses may be used. Conventionally, a thickness of the AuSn solder layer has been set thicker than 1 μm in order not to generate voids and in order to retain sufficiently strong bonding. By adopting the above-described embodiment methods, good bonding without generation of voids can be obtained even if a thickness of the AuSn solder layer 7 is set to 1 μm or thinner.

In each sample shown in FIG. 2, by thinning the AuSn solder layer 7, damages to a blade of a dicing apparatus were able to be reduced in a dicing process of semiconductor devices, although damages occurred when a conventional thick solder layer was used.

Further, in each sample shown in FIG. 2, as the AuSn solder layer 7 is thinned, the relative proportions of Au and Sn in the bonding layer changes greatly after bonding, as compared to using a conventional thick solder layer. Re-melting durability of the bonding layer can therefore be improved. When a semiconductor device is mounted on a circuit board or the like by reflow soldering, various problems can be mitigated including re-melting by heat during soldering, position displacement, stripping, sticking out of solder from an edge and the like, to be caused by re-melting.

In the embodiments described above, although the relative proportions of Au and Sn in the AuSn solder layer is set to about 7:3 in number of atoms, AuSn alloy having other relative proportions may also be used. It is preferable to set the relative proportions satisfying the condition that a melting point of the solder layer 7 having a lowered relative proportion of Sn after bonding is higher than a melting point of the solder layer 7 before melting. With such a relative proportions, re-melting durability of the bonding layer can be enhanced.

The present invention has been described in connection with the preferred embodiments. The invention is not limited only to the above embodiments. It will be apparent to those skilled in the art that other various modifications, improvements, combinations, and the like can be made.

What are claimed are:

1. A substrate bonding method comprising steps of:
   (a) forming a first Sn absorption layer on a principal surface of a first substrate, the first Sn absorption layer being made of metal that absorbs Sn from AuSn alloy and lowers a relative proportion of Sn in the AuSn alloy;
   (b) forming a second Sn absorption layer on a principal surface of a second substrate, the second Sn absorption layer being made of a metal that absorbs Sn from AuSn alloy and lowering a relative proportion of Sn in the AuSn alloy;
   (c) forming a solder layer made of AuSn alloy at least on one of the first and second Sn absorption layers; and
   (d) melting the solder layer to bond the first and second substrates together, in a state in which the principal surfaces of the first and second substrates face each other;
   wherein in step (d), Sn atoms in the solder layer diffuse into the first Sn absorption layer and the second Sn absorption layer, and a metal element of the first Sn absorption layer and second Sn absorption layer is dissolved in the melted solder layer, thereby forming a bonding layer including the first Sn absorption layer, the second Sn absorption layer, and the solder layer, with the metal element distributed across an entire thickness of the bonding layer.

2. The substrate bonding method according to claim 1, wherein the first and second Sn absorption layers are made of Ni.

3. The substrate bonding method according to claim 2, wherein the solder layer is formed only on one of the first and second Sn absorption layers, and a thickness of the Sn absorption layer on which the solder layer is formed is at least 100 nm.

4. The substrate bonding method according to claim 3, wherein a thickness of the Sn absorption layer on which the solder layer is not formed is at least 150 nm.

5. The substrate bonding method according to claim 2, wherein a total thickness of the first Sn absorption layer and the second Sn absorption layer is equal to or greater than 0.41 times a thickness of the solder layer.

6. The substrate bonding method according to claim 2, further comprising, after step (a), covering a surface of the first Sn absorption layer with an Au layer.

7. The substrate bonding method according to claim 2, further comprising, after step (b), covering a surface of the second Sn absorption layer with an Au layer.

8. The substrate bonding method according to claim 2, further comprising, after step (c), covering a surface of the solder layer with an Au layer.

9. The substrate bonding method according to claim 2, further comprising:
   after step (a), covering a surface of the first Sn absorption layer with a first Au layer;
   after step (b), covering a surface of the second Sn absorption layer with a second Au layer;
   wherein a total thickness of the Au layers disposed between the first and second Sn absorption layers is equal to or less than 0.39 times a total thickness of the solder layer formed on at least one of the first and second Sn absorption layers, in the state in which the principal surfaces of the first and second substrates face each other in step (d).

10. The substrate bonding method according to claim 1, wherein, in step (d), the Sn atoms in the solder layer diffuse into the first and second Sn absorption layers so that a relative proportion of Sn in the solder layer after solidification is smaller than a relative proportion of Sn in the solder layer before the melting.

11. The substrate bonding method according to claim 1, wherein a thickness of the solder layer before the melting is 1 μm or less.

12. The substrate bonding method according to claim 1, wherein the first substrate comprises an operation layer, and the substrate bonding method further comprises:
   forming an electrode on the operation layer after step (d); and
   performing heat treatment to ensure ohmic contact between the operation layer and the electrode.

13. The substrate bonding method according to claim 12, wherein the operation layer comprises AlGaInP-based compound semiconductor.

14. The substrate bonding method according to claim 9, further comprising, after step (c), covering a surface of the solder layer with a third Au layer.

* * * * *